United States Patent
Patel et al.

(10) Patent No.: US 9,618,858 B2
(45) Date of Patent: Apr. 11, 2017

(54) LITHOGRAPHIC APPARATUS AND A DEVICE MANUFACTURING METHOD INVOLVING THERMAL CONDITIONING OF A TABLE

(75) Inventors: Hrishikesh Patel, Eindhoven (NL); Johannes Henricus Wilhelmus Jacobs, Heeze (NL); Gerardus Adrianus Antonius Maria Kusters, Eindhoven (NL); Thibault Simon Mathieu Laurent, Eindhoven (NL); Marcio Alexandre Cano Miranda, Eindhoven (NL); Ruud Hendrikus Martinus Johannes Bloks, Helmond (NL); Peng Feng, Veldhoven (NL); Johan Gertrudis Cornelis Kunnen, Weert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 840 days.

(21) Appl. No.: 13/010,002

(22) Filed: Jan. 20, 2011

(65) Prior Publication Data

US 2011/0181849 A1    Jul. 28, 2011

Related U.S. Application Data

(60) Provisional application No. 61/297,414, filed on Jan. 22, 2010.

(51) Int. Cl.
G03F 7/20    (2006.01)

(52) U.S. Cl.
CPC ...... *G03F 7/70875* (2013.01); *G03F 7/70341* (2013.01); *G03F 7/70825* (2013.01); *G03F 7/70991* (2013.01); *Y10T 29/49* (2015.01)

(58) Field of Classification Search
CPC ............... G03F 7/70991; G03F 7/70875
USPC .......................................... 355/30, 72
See application file for complete search history.

(56) References Cited

U.S. PATENT DOCUMENTS

| 4,509,852 | A | 4/1985 | Tabarelli et al. |
| H1145 | H | 3/1993 | Anderson |
| 5,610,683 | A * | 3/1997 | Takahashi ............ 355/53 |
| 6,359,264 | B1 | 3/2002 | Schaper et al. |
| 6,534,750 | B1 * | 3/2003 | Tanoue et al. ......... 219/444.1 |

(Continued)

FOREIGN PATENT DOCUMENTS

| EP | 1 420 300 | 5/2004 |
| EP | 1 628 163 | 2/2006 |

(Continued)

OTHER PUBLICATIONS

Japanese Office Action mailed Sep. 4, 2012 in corresponding Japanese Patent Application No. 2011-009381.

*Primary Examiner* — Chia-How Michael Liu
(74) *Attorney, Agent, or Firm* — Pillsbury Winthrop Shaw Pittman LLP

(57) ABSTRACT

An immersion lithographic apparatus is provided having a substrate table including a drain configured to receive immersion fluid which leaks into a gap between an edge of a substrate on the substrate table and an edge of a recess in which the substrate is located. A thermal conditioning system is provided to thermally condition at least the portion of the recess supporting the substrate by directing one or more jets of fluid onto a reverse side of the section supporting the substrate.

21 Claims, 11 Drawing Sheets

(56) References Cited

U.S. PATENT DOCUMENTS

| | | | |
|---|---|---|---|
| 7,362,415 B2 | 4/2008 | Franken et al. | |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0087630 A1* | 4/2006 | Kemper | G03F 7/70341 355/30 |
| 2006/0087637 A1 | 4/2006 | Ottens et al. | |
| 2006/0119809 A1 | 6/2006 | Verhagen et al. | |
| 2006/0119815 A1 | 6/2006 | Franken et al. | |
| 2007/0000441 A1 | 1/2007 | Lue | |
| 2007/0070315 A1 | 3/2007 | Jacobs et al. | |
| 2008/0129969 A1 | 6/2008 | Peng et al. | |
| 2008/0137055 A1 | 6/2008 | Hennus et al. | |
| 2009/0279060 A1 | 11/2009 | Direcks et al. | |
| 2009/0279062 A1 | 11/2009 | Direcks et al. | |

FOREIGN PATENT DOCUMENTS

| | | |
|---|---|---|
| JP | 7-235588 | 9/1995 |
| JP | 10-312943 | 11/1998 |
| JP | 2005-252247 | 9/2005 |
| JP | 2006-165565 | 6/2006 |
| JP | 2008-172214 | 7/2008 |
| WO | 98/45875 | 10/1998 |
| WO | 98/57111 | 12/1998 |
| WO | 99/49504 | 9/1999 |
| WO | 2005/064405 | 7/2005 |

\* cited by examiner

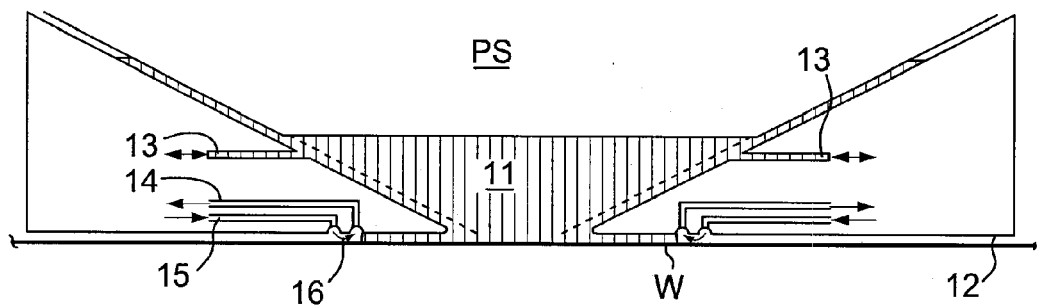
Fig. 5
Fig. 6
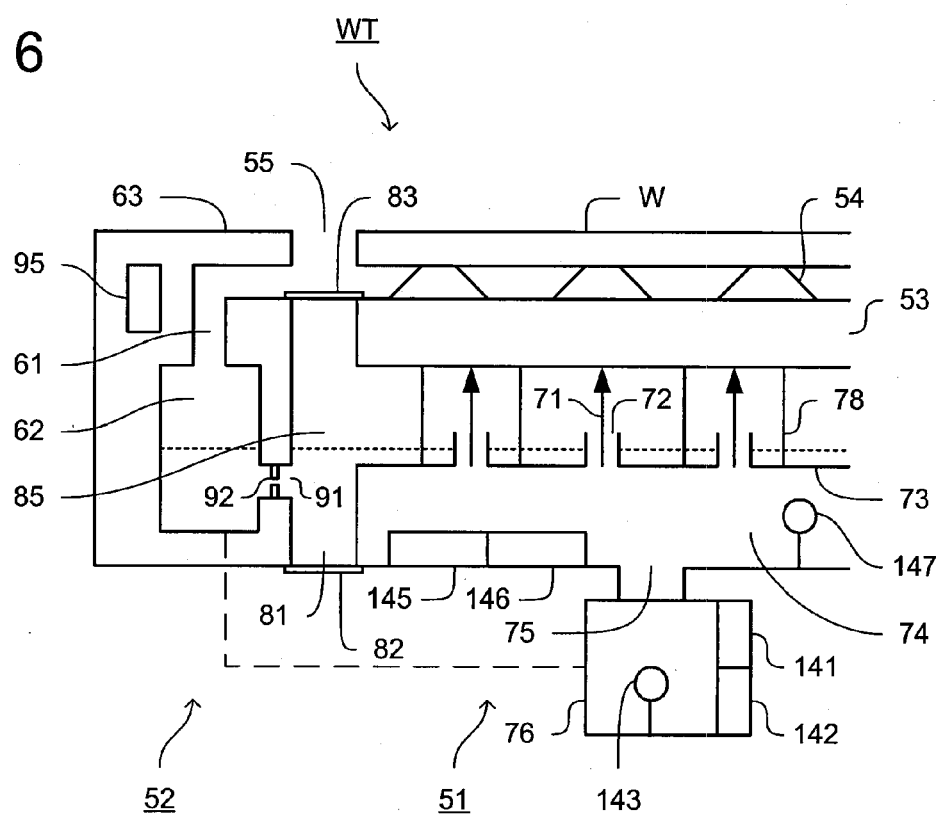

LITHOGRAPHIC APPARATUS AND A DEVICE MANUFACTURING METHOD INVOLVING THERMAL CONDITIONING OF A TABLE

This application claims priority and benefit under 35 U.S.C. §119(e) to U.S. Provisional Patent Application No. 61/297,414, entitled "A Lithographic Apparatus and A Device Manufacturing Method", filed on Jan. 22, 2010. The content of that application is incorporated herein in its entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

During the performance of a lithographic process, one or more sources of heat may introduce temperature variations across one or more elements within the lithographic apparatus. There may also be temperature variations in time. Such temperature distributions may introduce errors within the lithographic process.

It is desirable, for example, to provide a lithography process in which process errors introduced by one of more heat sources may be reduced or minimized.

According to an aspect, there is provided an immersion lithographic apparatus, comprising:
  a substrate table including a recess having a support section configured to support a substrate;
  a drain in the substrate table, the drain configured to receive an immersion fluid which leaks, in use, into a gap between an edge of a substrate on the substrate table and an edge of the recess; and
  a thermal conditioning system configured to thermally condition the support section of the recess, the thermal conditioning system comprising an aperture configured to direct a jet of fluid onto a reverse side of the support section of the recess that is opposite to a support side that supports the substrate.

According to an aspect, there is provided a device manufacturing method comprising:
  providing a substrate to a recess in a substrate table, the recess having a support section configured to support the substrate;
  providing immersion fluid to an upper surface of the substrate;
  extracting immersion fluid that leaks into a gap between an edge of the substrate and an edge of the recess through a drain in the substrate table; and
  thermally conditioning the support section of the recess by directing a jet of fluid onto a reverse side of the support section of the recess that is opposite a support side that supports the substrate.

According to an aspect, there is provided a lithographic apparatus, comprising:
- a substrate table including a recess having a support section configured to support a substrate, and a peripheral section surrounding the recess; and
- a thermal conditioning system configured to thermally condition the support section of the recess and the peripheral section of the substrate table, the thermal conditioning system comprising an aperture configured to direct a jet of fluid onto a reverse side of the support section of the recess that is opposite to a support side that supports the substrate, and an aperture configured to direct a jet of fluid onto a portion of the peripheral section of the substrate table.

According to an aspect, there is provided a device manufacturing method comprising: providing a substrate to a recess in a substrate table, the recess having a support section configured to support the substrate and the substrate table having a peripheral section surrounding the recess;
- thermally conditioning the support section of the recess by directing a jet of fluid onto a reverse side of the support section of the recess that is opposite a support side that supports the substrate; and
- thermally conditioning the peripheral section of the substrate table by directing a jet of fluid onto a portion of the peripheral section of the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 depicts a portion of a substrate table according to an embodiment of the invention;

DETAILED DESCRIPTION

Figure 1:
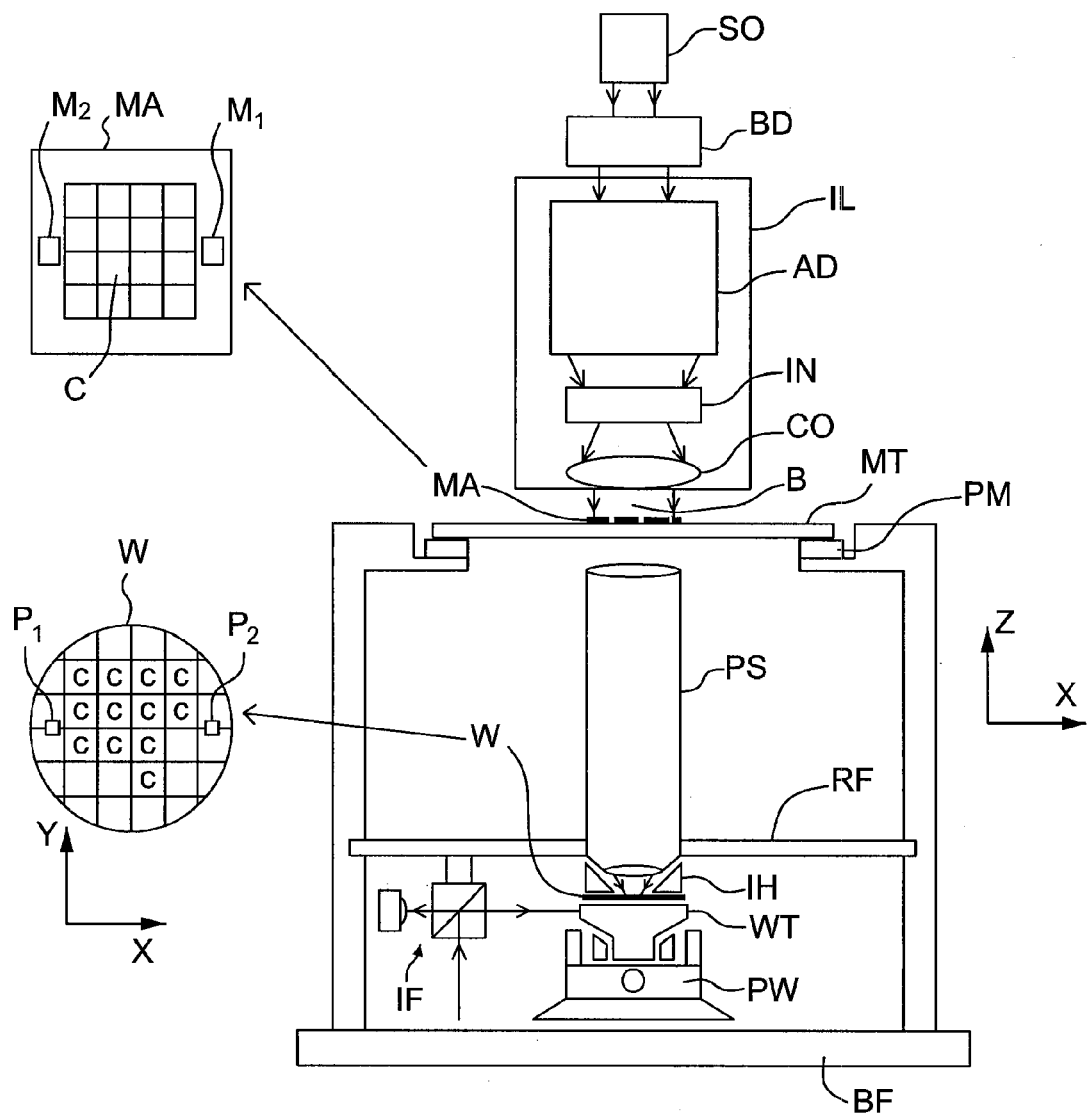
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables at least one or all of which may hold a substrate (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
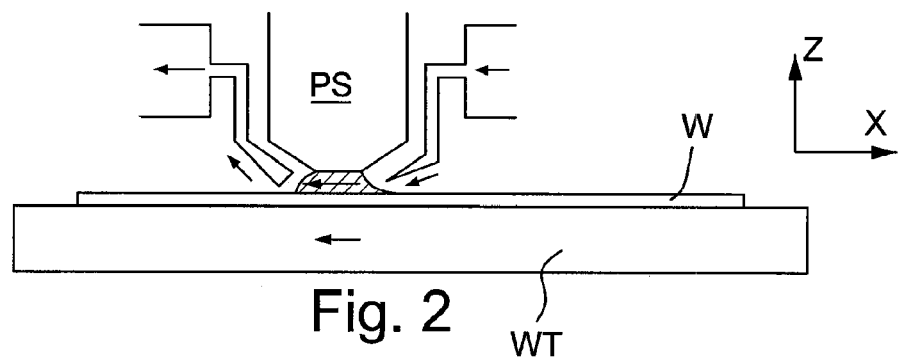
FIGS. 2 and 3 depict a liquid supply system for use in a lithographic projection apparatus.
Figure 3:
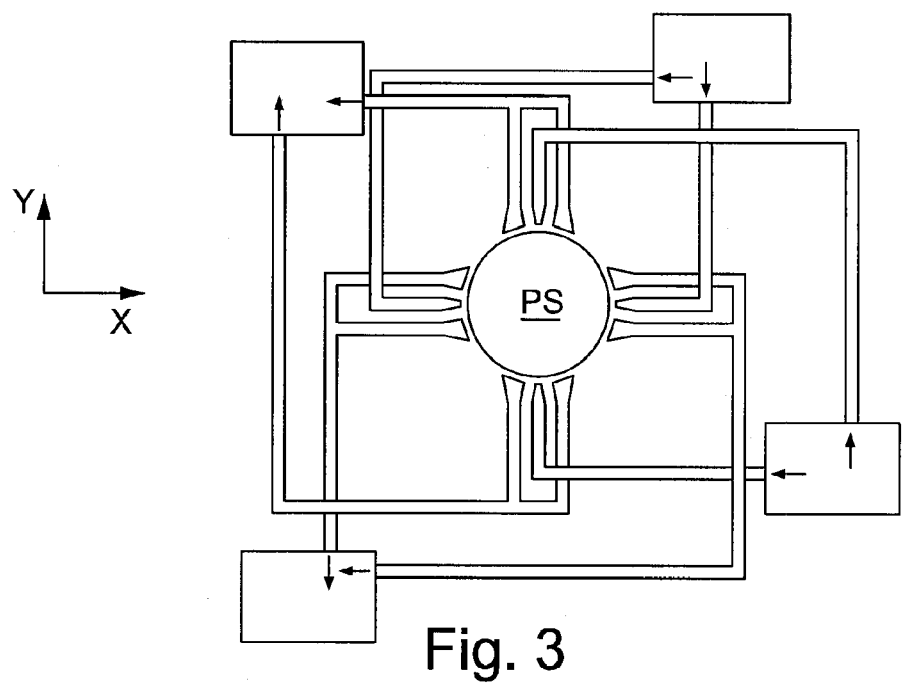

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
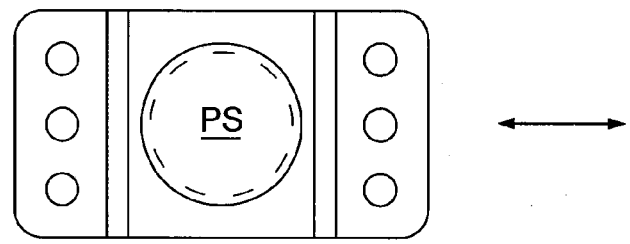
FIG. 4 depicts a further liquid supply system for use in a lithographic projection apparatus.
Figure 4:
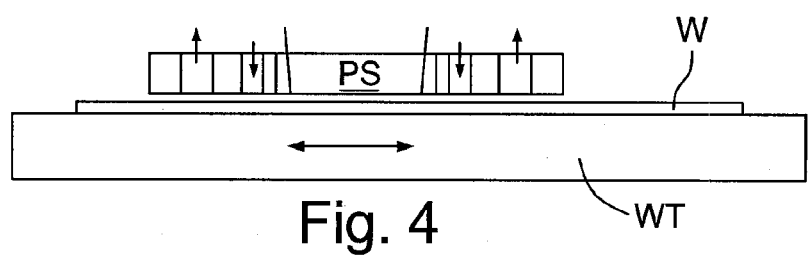

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. In an arrangement, the apparatus has only one table, or has two tables of which only one can support a substrate.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Another arrangement which has been proposed is to provide the liquid supply system with a fluid handling structure. The fluid handling structure may extend along at least a part of a boundary of the space between the final element of the projection system and the substrate table. Such an arrangement is illustrated in FIG. 5. The fluid handling structure is substantially stationary relative to the projection system in the XY plane though there may be some relative movement in the Z direction (in the direction of the optical axis). A seal is formed between the fluid handling structure and the surface of the substrate. In an embodiment, a seal is formed between the fluid handling structure and the surface of the substrate and may be a contactless seal such as a gas seal. Such a system is disclosed in United States patent application publication no. US 2004-0207824. In another embodiment the fluid handling structure has a seal which is a non-gaseous seal, and so may be referred to as a liquid confinement structure.

FIG. 5 schematically depicts a localized liquid supply system or fluid handling structure or device with a body 12 forming a barrier member or liquid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid handling structure is substantially stationary relative to the projection system PS in the XY plane though there may be some relative movement in the Z direction (generally in the direction of the optical axis). In an embodiment, a seal is formed between the body 12 and the surface of the substrate W and may be a contactless seal such as a gas seal or fluid seal.

The fluid handling structure at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling structures which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly lyophilic (e.g., hydrophilic), i.e. having a contact angle of less than 90° to the immersion liquid, e.g. water.

Many other types of liquid supply system are possible, for example a gas drag arrangement where a liquid meniscus is pinned at outlet openings by two phase extraction such as is disclosed in United States patent application publication nos US 2009-0279060 and US 2009-0279062, each hereby incorporated in its entirety by reference. The invention is not limited to any particular type of liquid supply system. The invention may be advantageous for use with a confined immersion system in which the liquid between the final element of the projection system and the substrate is confined, for example, in optimizing the use. However, the invention may be used with any other type of liquid supply system.

FIG. 6 schematically depicts a portion of a substrate table WT according to an embodiment of the invention. As shown, the substrate table WT includes a central section 51 to support the substrate W and a peripheral section 52 that surrounds the central section 51. The central section 51 includes a support section 53 which may include protrusions 54 to support the underside of the substrate W. The space surrounding the protrusions 54 may be evacuated in order to secure the substrate W to the support section 53.

The support section 53 of the central section 51 of the substrate table WT may be arranged to form a recess within the substrate table WT. The recess may also be partially defined by the peripheral section 52. For example, as depicted in FIG. 6, the substrate table WT may be configured such that the upper surface of the peripheral section 52 is substantially coplanar with the upper surface of a substrate W supported by the substrate table WT. An edge of the peripheral section 52 may define the edge of the recess of the substrate table WT in which the substrate W is supported.

The peripheral section 52 may include a drain, which is configured to receive immersion fluid which leaks, in use, into a gap 55 between the edge of the substrate W and the edge of the recess. Extraction through the drain may be used to remove bubbles from the gap between the edge of the substrate W and the edge of the recess in the substrate table WT.

As shown in FIG. 6, the drain may include an opening 61 through which the immersion liquid may pass to an extraction conduit 62. For example, the opening 61 may be provided in the form of a channel extending around the peripheral section 52 of the substrate table WT. Alternatively or additionally, the opening 61 may be provided in the form of a plurality of discrete openings. As shown, the drain may include a cover section 63 that extends across the opening 61 to the edge of the recess in which the substrate W is supported and be arranged such that the immersion liquid passes under the cover 63 before entering the opening 61.

The extraction conduit 62 may extend around the peripheral section 52 of the substrate table WT and may, in turn, be connected by one or more conduits to an under pressure source which extracts the immersion liquid, for example in order to return the immersion liquid to a reservoir.

As depicted in FIG. 6, the central section 51 of the substrate table WT includes a thermal conditioning system which is arranged to thermally condition the support section 53 of the substrate table WT. In other words, the thermal conditioning system is arranged to reduce or minimize any variations in temperature of the support section 53, across the width of the support section 53 and/or over time.

The thermal conditioning system may comprise one or more apertures 72 arranged to each or together provide a jet 71 of fluid, such as a liquid, onto the underside of the support section 53 of the substrate table WT. In this case, it will be understood that the underside of the support section 53 is the side of the support section 53 that is opposite to the side of the support section 53 that supports the substrate W. The provision of the jet 71 of liquid may efficiently extract heat from the support section 53 of the substrate table WT. Accordingly, temperature variations of the support section 53 of the substrate table WT may be reduced.

The support section 53 may be selected to be as thermally conductive as possible, subject to other constraints. Accordingly, the support section 53 may be formed from a thermally conductive material, for example SiSiC. The support section 53 may also be as thin as possible, while still providing sufficient structural rigidity in order to support the substrate W.

The one or more apertures 72 may be formed in an aperture plate 73 that is provided adjacent to the support section 53 such that the one or more jets 71 of liquid may be directed onto the underside of the support section 53. The or each aperture 72 is connected to a manifold 74 arranged to distribute the liquid to the respective aperture 72.

As shown in FIG. 6, in an embodiment, the manifold 74 may be provided immediately adjacent to the aperture plate 73. In particular, the manifold 74 may be partly formed by the aperture plate 73. Providing the manifold 74 as close as possible to the one or more apertures 72 may reduce or minimize temperature variations in the liquid provided to the or each aperture 72. In turn, this may reduce temperature variations in the support section 53.

As depicted in FIG. 6, an inlet 75 may be arranged to provide the liquid to the manifold 74 from a reservoir 76. In an embodiment, multiple openings may be provided into the manifold 74 from the reservoir 76. This may further reduce the variation of temperature of liquid within the manifold 74. In turn this may further reduce the variation of temperature of the jet 71 of liquid from the or each aperture 72.

The aperture plate 73 may be selected to reduce or minimize thermal conduction. This may reduce or minimize any temperature variations of the jet 71 of liquid provided by the or each aperture 72. Furthermore, if the aperture, plate 73 forms part of the manifold 74, reducing the thermal conductivity of the aperture plate 73 may reduce any temperature variations of the liquid within the manifold 74. If the aperture plate 73 forms part of the manifold 74 as depicted in FIG. 6, the aperture plate 73 may also be selected to provide sufficient stiffness to contain the liquid within the manifold 74 at the pressure necessary to provide the jet 71 of liquid. For example, the pressure may be, for example, 0.3 to 1.5 bar.

The one or more apertures 72 may be provided in any suitable arrangement. For example, for a liquid pressure of 0.3 to 1.5 bar, the one or more apertures 72 may be, for example, 100 to 300 µm in cross-sectional width (e.g., diameter). Furthermore, the aperture plate 73 may include any number of apertures 72. For example, the aperture plate 73 may include, for example 500 to 5000 apertures 72, each providing a jet 71 of liquid to the underside of the support section 53. For an arrangement in which the one or more apertures 72 have the width of approximately 100 µm, the depth of the manifold 74 may be approximately 2 to 3 mm in order to provide an even distribution of the liquid to the one or more apertures 72.

As depicted in FIG. 6, in an embodiment, one or more thin walls 78 may be provided to support the support section 53 above the aperture plate 73. The one or more walls 78 may be configured to minimize or reduce the transfer of heat between the support section 53 and the aperture plate 73.

For example, as depicted in FIG. 6, the one or more walls 78 may be provided in the form of hollow pillars. In such an arrangement, one or more of the apertures 72 may be located within such a hollow pillar. Therefore a jet 71 of liquid may be provided within the hollow pillar.

In an embodiment, the hollow pillars may be circular or elliptical in cross-section.

In an embodiment, the hollow pillars may be rectangular, for example square, in cross-section. In such arrangement, some of the edges of the hollow pillars may be arranged to be parallel to the scanning direction of the substrate table WT in use. Alternatively or additionally, some of the edges may be aligned with another direction of movement of the substrate table, in which the substrate table may be moved at relatively high acceleration. Such an arrangement may provide maximum rigidity in the direction in which the substrate table WT undergoes the largest acceleration during use.

In an embodiment, the one or more walls 78 supporting the support section 53 from the aperture plate 73 may be provided in the form of multiple connecting ribs, namely planar sections of wall 78. For example, a plurality of planar sections of wall that are parallel to each other may be provided. As with the rectangular cross-section pillars, the ribs may be oriented to be parallel to, for example, the scanning direction of the substrate table WT in use in order to maximize the rigidity. It will be appreciated that in such arrangements, a line within a plane of the walls will be parallel to the scanning direction.

The one or more walls 78, regardless of their configuration, may be thermally conditioned by one or more appropriately oriented jets 71 of liquid. Alternatively or additionally, the one or more walls 78 may be adequately thermally conditioned by liquid after it has been directed onto the underside of the support section 53.

Although not depicted in FIG. 6, it will be appreciated that one or more openings may be provided within the one or more walls 78 separating the support section 53 from the aperture plate 73 in order to permit the movement of the liquid after it has been directed onto the underside of the support section 53.

Furthermore, although not depicted in FIG. 6, one or more walls may be provided within the manifold 74, for example supporting the aperture plate 73 in order to provide strength and rigidity to the manifold 74. The one or more walls within the manifold 74 may, for example, be arranged according to one of the arrangements discussed above for the one or more walls 78 supporting the support section 53.

In an embodiment, the central section 51 of the substrate table WT may be separated from the peripheral section 52. For example, the central section 51 and the peripheral section 52 may be separated by an isolation system that is configured to reduce or minimize the transfer of heat, or of vibrations, or of both between the central section 51 and the peripheral section 52.

For example, as depicted in FIG. 6, in an embodiment, a gap 81 may be provided between the central section 51 and the peripheral section 52. Accordingly, the central section 51 and the peripheral section 52 may be separated by a distance of, for example, 50 to 300 µm. Although the central section 51 may be separated from the peripheral section 52, it will be appreciated that sealing members 82, 83 may be provided to provide a liquid and/or gas type seal between portions of the central section 51 and the peripheral section 52, while reducing or minimizing the possible transfer of heat and/or vibrations between the central section 51 and the peripheral section 52. For example, as shown in FIG. 6, a sealing member (which may be referred to as a "sticker"), and which may be made from a metal, such as stainless steel, may be attached between the lower surfaces of the central section 51 and the peripheral section 52. Such a sealing member may contain the liquid after it has been directed onto the underside of the support section 53 prior to extraction and return to the liquid reservoir 76, for example. It will be appreciated that other known sealing members may be used.

In an embodiment, as depicted in FIG. 6, a sealing member. 83 is provided between the central section 51 and the peripheral section 52 of the substrate table WT in order to seal a space 85 that is defined by the support section 53 of the substrate table WT, the aperture plate 73 and a portion of the peripheral section 52. As will be appreciated, the one or more jets 71 of liquid are provided within this sealed space 85. Such an arrangement may be beneficial because it may become fully humid in use, namely saturated with the vapor of the liquid used in the thermal conditioning system. Evaporation of the liquid may be prevented, producing the possible causes of temperature variations within the space 85.

In an embodiment, the space 85 is not sealed, for example by omitting the second sealing member 83. Such an arrangement may beneficially enable non-uniform or fluctuating extraction rates of the liquid from the space 85.

In an embodiment, the System to extract liquid from the space 85 after it has been directed onto the underside of the support section 53 of the substrate table WT may be specifically configured to help ensure that the aperture plate 73 always retains a continuous film of liquid across its entire surface shown, for example, as the line of short dashes in FIG. 6. This may reduce evaporation of the liquid from the surface of the aperture plate 73, reducing a possible source of temperature variation over the surface of the aperture plate 73, the surface of any nozzle in which the one or more apertures 72 are provided and/or the surface of the one or more walls 78. However, it may be desirable to minimize the thickness of any layer of liquid on the surface of the aperture plate 73. This may reduce the mass of the substrate table WT in use. In addition, this may reduce the effects of sloshing of the liquid caused by the movement of the substrate table WT in use.

As noted above, a variety of liquids or other fluids may be used within the thermal conditioning system. For example, the liquid may be water. In an embodiment, the liquid may be the same as the immersion liquid. In such an arrangement, a single extraction system may be used to extract liquid from the drain that receives immersion liquid that leaks into the gap 55 between the edge of the substrate on the substrate table and the edge of the recess, and the liquid after it has been directed onto the underside of the support section 53 of the substrate table WT. In an embodiment, the liquid used in the thermal conditioning system may be a thermally conductive and electrically insulating liquid, such as Fluorinert, manufactured by 3M.

In an embodiment, as depicted in FIG. 6, one or more openings 91 may be provided from a part of the space 85 in which the one or more jets 71 of liquid are provided to the extraction conduit 62 that is used to extract the liquid from the drain. Accordingly, a common conduit 62 may be used and may return liquid to a common reservoir 76. The liquid may be suitably conditioned before it is returned to the reservoir 76.

In an embodiment, downstream of the one or more openings 61 and the one or more openings 91, the extraction conduit 62 may be provided with a vent with a suitable flow restrictor. This may reduce the pressure fluctuation inside the space 85 in which the one or more jets 71 of liquid are provided, even when there are fluctuations in the extraction pressure.

In an embodiment, a flow restrictor 92 may be provided to restrict the flow of liquid from the space 85 in which the one or more jets 71 of liquid are provided into the extraction conduit 62. It will be appreciated that the positioning of the one or more openings 91 and the configuration of any flow restrictor 92 may be used in order to control the level of the liquid within the space 85.

Figure 19:
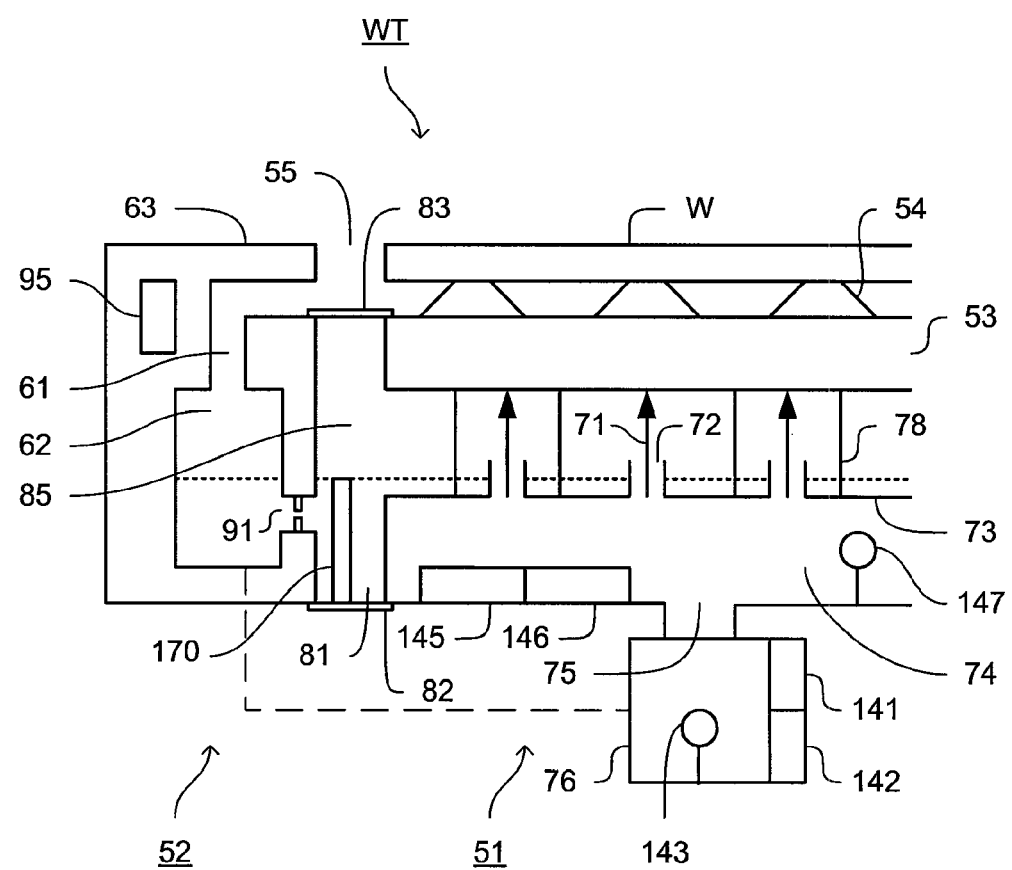
FIG. 19 depicts a portion of a substrate table according to an embodiment of the invention.

In an embodiment, which is depicted in FIG. 19 and is a variation of the embodiment depicted in FIG. 6, a wall 170 may be provided within the space 85 within which the one or more jets 71 of liquid are provided. As shown in FIG. 19, the wall 170 may function as a dam, separating the region surrounding the one or more apertures 72 from the one or more openings 91 into the conduit 62. The wall 170 may be used to help ensure the level of the liquid within the space around the one or more jets 71 of liquid. The wall 170 may assist in ensuring that only liquid is extracted through the one or more openings 91 into the conduit 62.

In an embodiment, the flow of liquid through the common extraction conduit 62 within the peripheral section 52 of the substrate table WT may be used in order to thermally condition the peripheral section 52. For example, the common extraction conduit 62 may be arranged such that the liquid flows throughout the peripheral section 52 of the substrate table WT. In this respect, it may be noted that the temperature change of the liquid that has been directed onto the underside of the support section 53 of the substrate table WT may be of the order of 18 to 24 mK. Accordingly, the liquid extracted from the space 85 in which the one or more jets 71 of liquid are provided may be adequate for thermally conditioning the peripheral section 52 of the substrate table WT. Alternatively or additionally, in an embodiment, a heater 95 may be provided within the peripheral section 52 of the substrate table WT in order to provide thermal conditioning of the peripheral section 52.

Figure 7:
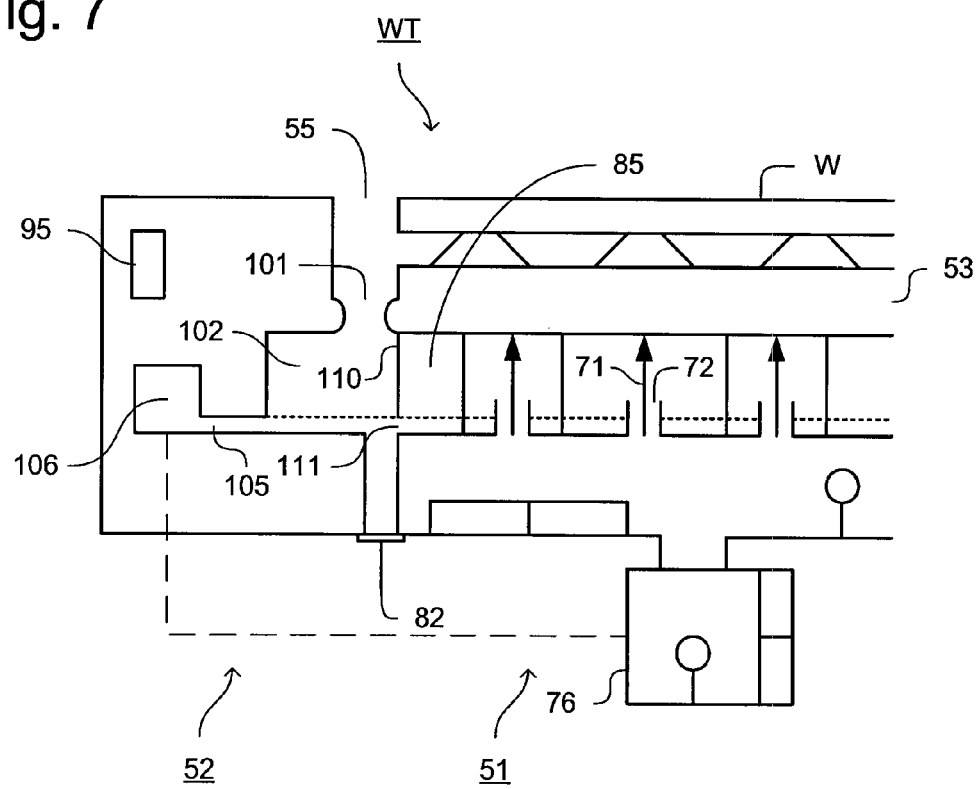
FIG. 7 depicts a portion of a substrate table according to an embodiment of the invention.

FIG. 7 depicts an arrangement of a substrate table WT that is similar to the embodiment discussed above in relation to FIG. 6 but differs in the arrangement of the drain. For brevity, only the differences will be discussed. In particular, in the arrangement depicted in FIG. 7, the drain is configured such that a narrowed gap 101 is provided directly below the gap 55 between the edge of the substrate W and the edge of the recess within the substrate table WT. Extraction through the drain may be used to prevent or reduce leakage of liquid to the underside of the substrate W.

As depicted in FIG. 7, the narrowed gap 101 may be provided between a projection on the support section 53 of the central section 51 of the substrate table WT and a projection on the edge of the peripheral section 52 of the substrate table WT. It should be appreciated, however, that although in FIG. 7 the projections are presented as being the same size, this is not necessarily the case. Indeed, either projection may be larger than the other or may be omitted.

Immediately below the narrowed gap 101, a chamber 102 is provided which is in fluid communication with the atmosphere above the substrate table WT. In an embodiment, a line can be drawn straight down from the outside of the substrate table WT through the narrowed gap 101 between the projections into the chamber 102. In an embodiment, that line is a vertical line and/or intercepts the boundary of the chamber 102 on a bottom wall of the chamber 102. If the dimensions of the narrowed gap 101 and the chamber 102 are correctly chosen, this arrangement may have an advantage that a gas knife, which may be used in the liquid supply system in order to help contain liquid, is not influenced by the presence of the gap 101 because the gas knife does not "feel" the bottom of the chamber 102.

In an embodiment, the pressure of gas in the chamber 102 is maintained at the same pressure as gas outside of the substrate table WT (i.e. ambient gas pressure). This means that there is, in normal operation, substantially no gas flow through the gap 101 when the gap 101 is not covered by the liquid supply system and one or more gas flow devices of the liquid supply system are blowing gas through the gap 55. Even if the liquid supply system covers part of the gap 55, ambient pressure may still be maintained in the chamber 102 because the chamber 102 is annular (or another shape that extends around the peripheral section 52 of the substrate table WT) and will be open to the atmosphere above the substrate table WT through the gap 55 at another location around the periphery of the substrate W.

In order to remove liquid from the chamber 102, liquid may be removed in a manner that does not create an under pressure in the chamber 102. For example, liquid may be removed from the chamber 102 using, for example, capillary action in a capillary passage 105 into an extraction conduit 106. Alternatively, for example, one or more liquid removal devices may be provided, for example which only apply an under pressure to passage 105 when the presence of liquid at the mouth of the passage 105 in the chamber 102 is detected. Alternatively or additionally, a microsieve single phase extractor (see European patent application publication no. EP 1 628 163, for example) may be used to remove liquid from the chamber 102.

Alternatively or additionally, a controller may control whether an under pressure source is connected to a portion of the chamber 102 when the liquid supply system 12, which supplies liquid to only a localized area of the substrate (in plan) at any one time, is located over the gap 55 such that liquid in the liquid supply system drains into the gap 55. When the liquid supply system is not located over the gap 55, the under pressure source is not connected to the chamber 102. Thus, during most of the time, the chamber 102 is at ambient pressure, but when liquid is dropping into the chamber 102 or is present in the chamber 102 an under pressure source is applied through a channel 105 to remove the liquid entering the chamber 102.

As with the arrangement in FIG. 6, in an arrangement having a drain as discussed above and as depicted in FIG. 7, a common extraction channel may be used to extract the liquid that leaks through the gap 55 between the edge of the substrate W and the edge of the recess, and the liquid that has been directed onto the underside of the support section 53 of the substrate table WT. Accordingly, for example, the liquid that has been directed onto the underside of the support section 53 may pass into the chamber 102 that forms part of the drain within the peripheral section of the substrate table WT.

If it is desired to seal the space 85 within which the one or more jets 71 of liquid are provided, in an embodiment, a wall 110 may be provided to separate the space 85 from the chamber 102. As shown in FIG. 7, one or more openings 111 may be provided to pass liquid from the space 85 in which the one or more jets 71 of liquid are provided into the chamber 102.

Figure 8:
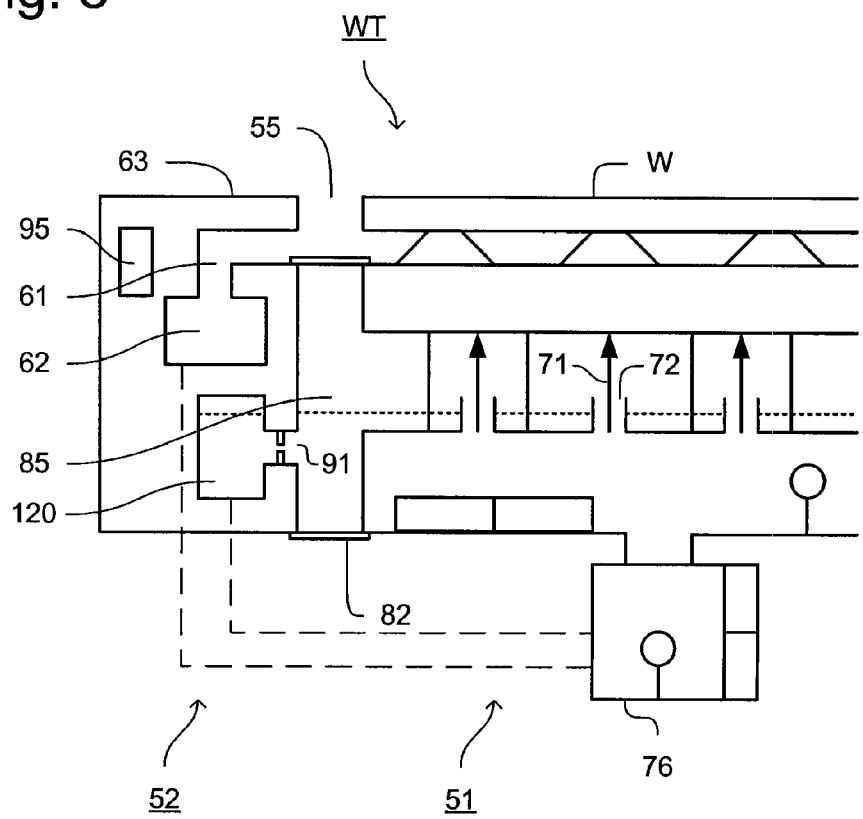
FIG. 8 depicts a portion of a substrate table according to an embodiment of the invention.

FIG. 8 depicts a portion of a substrate table WT according to a further embodiment of the invention. Again, only the differences between the arrangement depicted in FIG. 6 and that depicted in FIG. 8 will be discussed.

As shown in this embodiment, separate extraction conduits are provided for the liquid to be extracted from the drain and for liquid to be extracted from the thermal conditioning system. Specifically, as shown, liquid that leaks through the gap 55 between the edge of the substrate W and the edge of the recess in the substrate table WT may be extracted via a first extraction conduit 62 within the peripheral section 52 of the substrate table WT. A second extraction conduit 120 may be provided to extract liquid from the space 85 within which the one or more jets 71 of liquid are provided.

As shown, in an embodiment, the second extraction conduit 120 may be provided within the peripheral section 52 of the substrate table WT.

It will be appreciated that the flow of liquid through the second extraction conduit 120 may, in particular, be used to thermally condition the peripheral section 52 of the substrate table WT. As with the arrangement depicted in FIG. 6, a flow restrictor 92 may be provided in order to control the flow of liquid into the second extraction conduit 120.

The first and second extraction conduits 62, 120 may, as schematically represented in FIG. 8, return the liquid to a common reservoir 76. Alternatively, the first and second extraction conduits 62, 120 may return liquid to separate reservoirs. Accordingly, the liquid extracted by the drain and the liquid used in the thermal conditioning system may be kept separate. In either case, the liquid may be suitably conditioned before it is returned to the reservoir.

Figure 9:
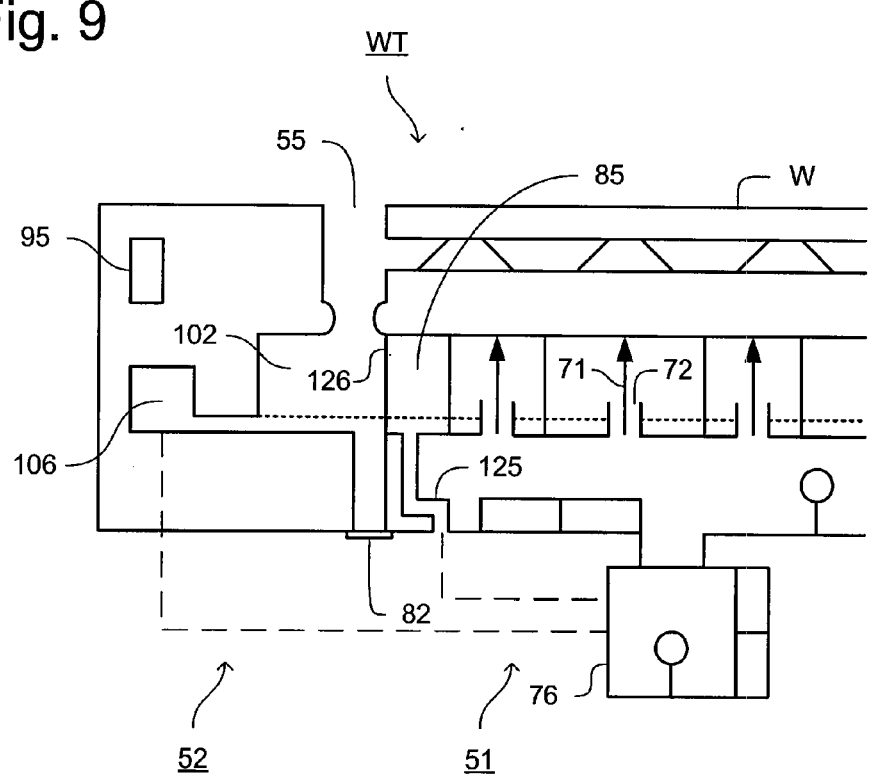
FIG. 9 depicts a portion of a substrate table according to an embodiment of the invention.
Figure 10:
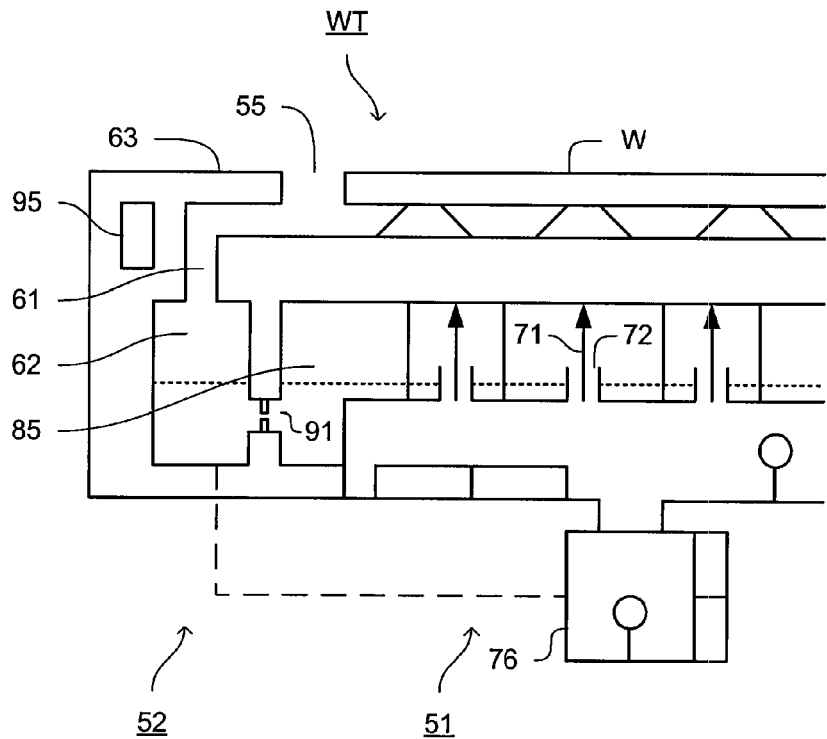
FIG. 10 depicts a portion of a substrate table according to an embodiment of the invention.
Figure 11:
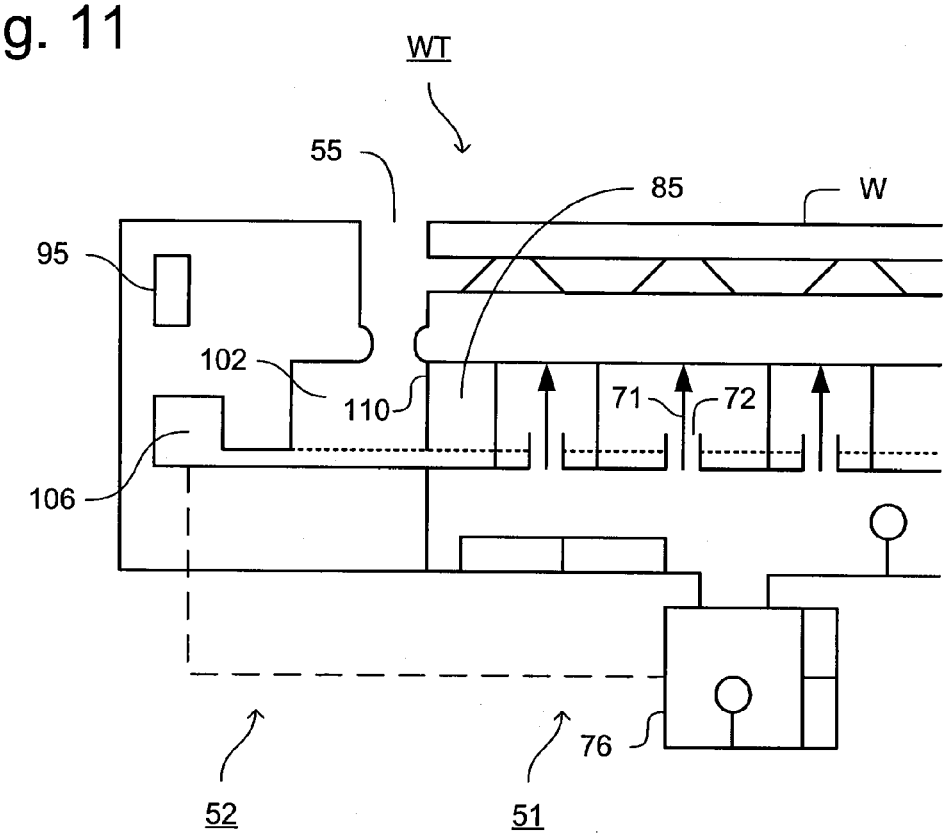
FIG. 11 depicts a portion of a substrate table according to an embodiment of the invention.
Figure 12:
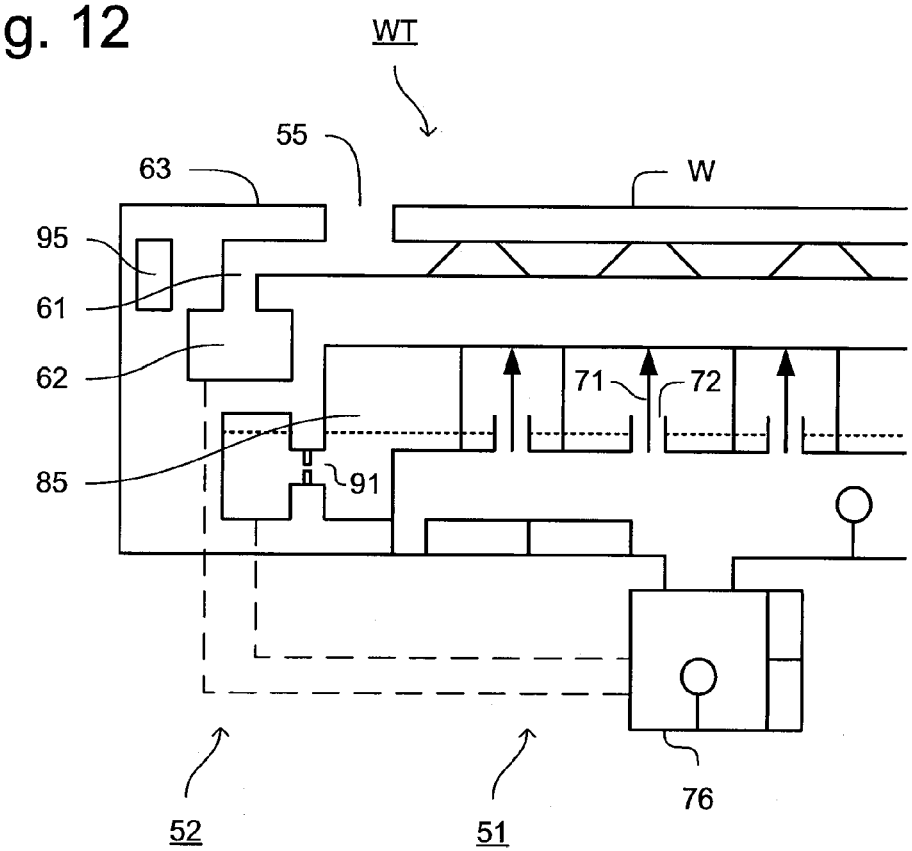
FIG. 12 depicts a portion of a substrate table according to an embodiment of the invention.
Figure 13:
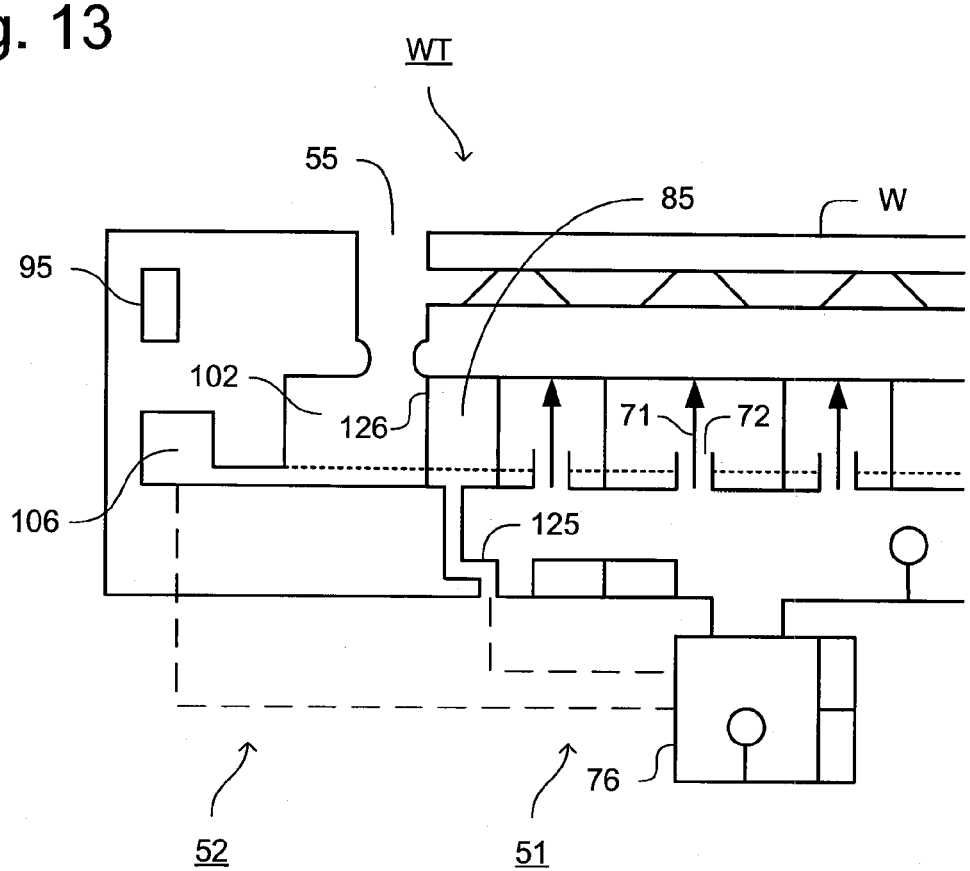
FIG. 13 depicts a portion of a substrate table according to an embodiment of the invention.

FIG. 9 schematically depicts a further embodiment of a substrate table WT. As shown, in this embodiment, a drain arrangement such as that depicted in FIG. 7 and described above is provided but with a first extraction conduit 106 for the drain and a second extraction conduit 125 within the central portion 51 of the substrate table WT to extract liquid from the space 85 within which the one or more jets 72 of liquid as provided. In an embodiment, as depicted in FIG. 9, if it is desired to seal the space 85 within which the one or more jets 71 of liquid are provided, no openings may be provided in wall 126 that is provided to separate the space 85 from the chamber 102 of the drain.

It should be appreciated that in embodiments such as that depicted in FIG. 9, in which separate extraction conduits 106,125 are provided for the extraction of liquid from the drain and extraction of liquid from the thermal conditioning system, the separate extraction conduits may return the liquid to a common reservoir 76 or to separate reservoirs.

FIGS. 10 to 13 depict further variations of the embodiments depicted in FIGS. 6 to 9, respectively. In each case, the only difference between the embodiments is that the substrate table WT is not separated into a central section and a peripheral section by an isolation system but is a single integral substrate table. Accordingly, sealing members 82, 83 shown in FIG. 6 are not required, for example.

In each of the embodiments discussed above in relation to FIGS. 6 to 13, the one or more jets 71 of liquid are provided from the or each aperture 72 formed in one or more nozzles on the aperture plate 73. However, it should be appreciated that one or more nozzles need not be provided. Accordingly, in embodiments of the invention which may be used in conjunction with any of the embodiments depicted in FIGS. 6 to 13, the one or more apertures 72 may be coplanar with the upper surface of the aperture plate 73. In other words, the one or more apertures 72 may be formed in the surface of the aperture plate 73 that faces the support section 53 of the recess in the substrate table WT. Such an arrangement is depicted in FIG. 14.

Figure 15:
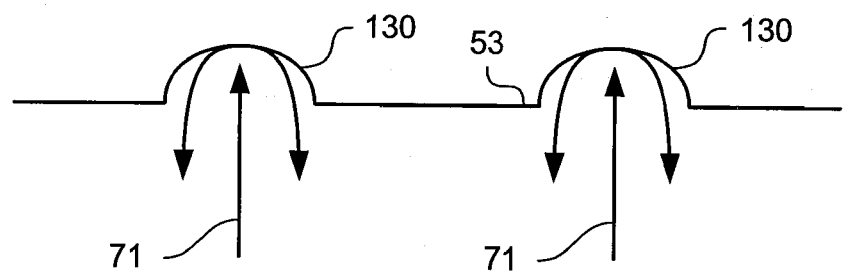
FIG. 15 depicts a portion of a thermal conditioning system according to the invention.

In an embodiment that may be combined with any of the embodiments discussed above, the lower surface of the support section 53, namely the surface on which the one or more jets 71 of liquid are directed, may include an indent that is associated with the or each jet 71 of liquid. Such an arrangement is depicted in FIG. 15. The one or more indents 130 may be arranged such that the liquid in the jet 71 of liquid that is directed into the indent 130 is directed back towards the aperture plate 73. For example, the liquid may be re-directed such that it does not interfere with liquid from an adjacent jet. It should be appreciated that re-directed liquid from adjacent jets may combine when traveling back towards the aperture plate 73.

In an embodiment that may be combined with any of the embodiments discussed above, the space 85 within which the one or more jets 71 of liquid are provided may be entirely filled with the liquid such that the one or more jets 71 of liquid are provided within the bulk of liquid.

Figure 14:
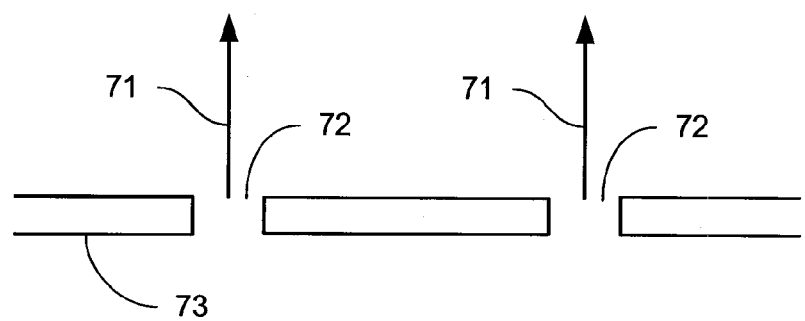
FIG. 14 depicts a portion of a thermal conditioning system according to the invention.
Figure 16:
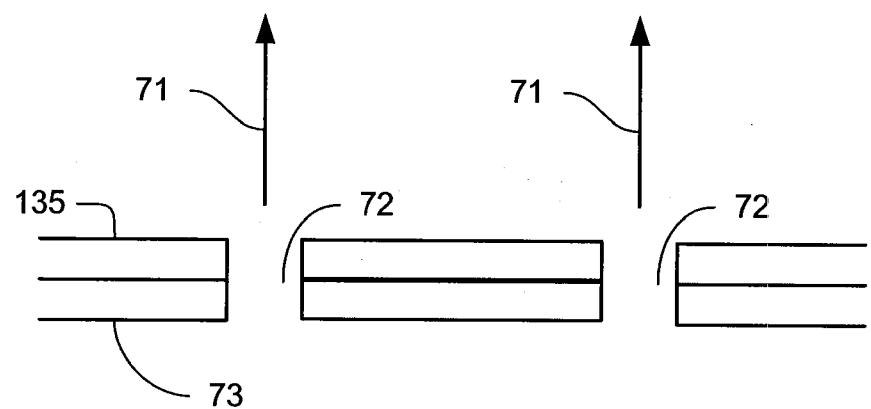
FIG. 16 depicts a portion of a thermal conditioning system according to the invention.

As discussed above, in any of the embodiments depicted in FIGS. 6 to 13, including embodiments combined with the arrangements depicted in FIGS. 14 and/or 15, the extraction of liquid from the space 85 within which the one or more jets 71 of liquid are provided may be arranged such that there remains a permanent layer of liquid on the aperture plate 73. As previously explained, it may be beneficial to ensure that this layer is as thin as possible in order to prevent sloshing. Alternatively or additionally, as depicted in FIG. 16, a layer of porous material may be provided on the aperture plate 73. The porous material may help ensure that a continuous layer of liquid remains on the aperture plate 73, reducing the possible heat load caused by drying of portions of the aperture plate 73. The porous material 135 may prevent or reduce the sloshing of liquid during movement of the substrate table WT. The porous material may be selected to have a relatively low thermal conductivity. For example, it may be formed from polytetrafluoroethylene (PTFE), ceramic such as Zerodur manufactured by Schott AG, quartz or polyacetal co-polymer (POM).

In any of the embodiments discussed above, the thermal conditioning system provides liquid to the support section 53 of the substrate table WT in order to thermally condition the support section 53 and, in turn, the substrate W supported upon the support section 53. It will be appreciated that, in order to do so, the temperature of the liquid may be carefully controlled.

Figure 17:
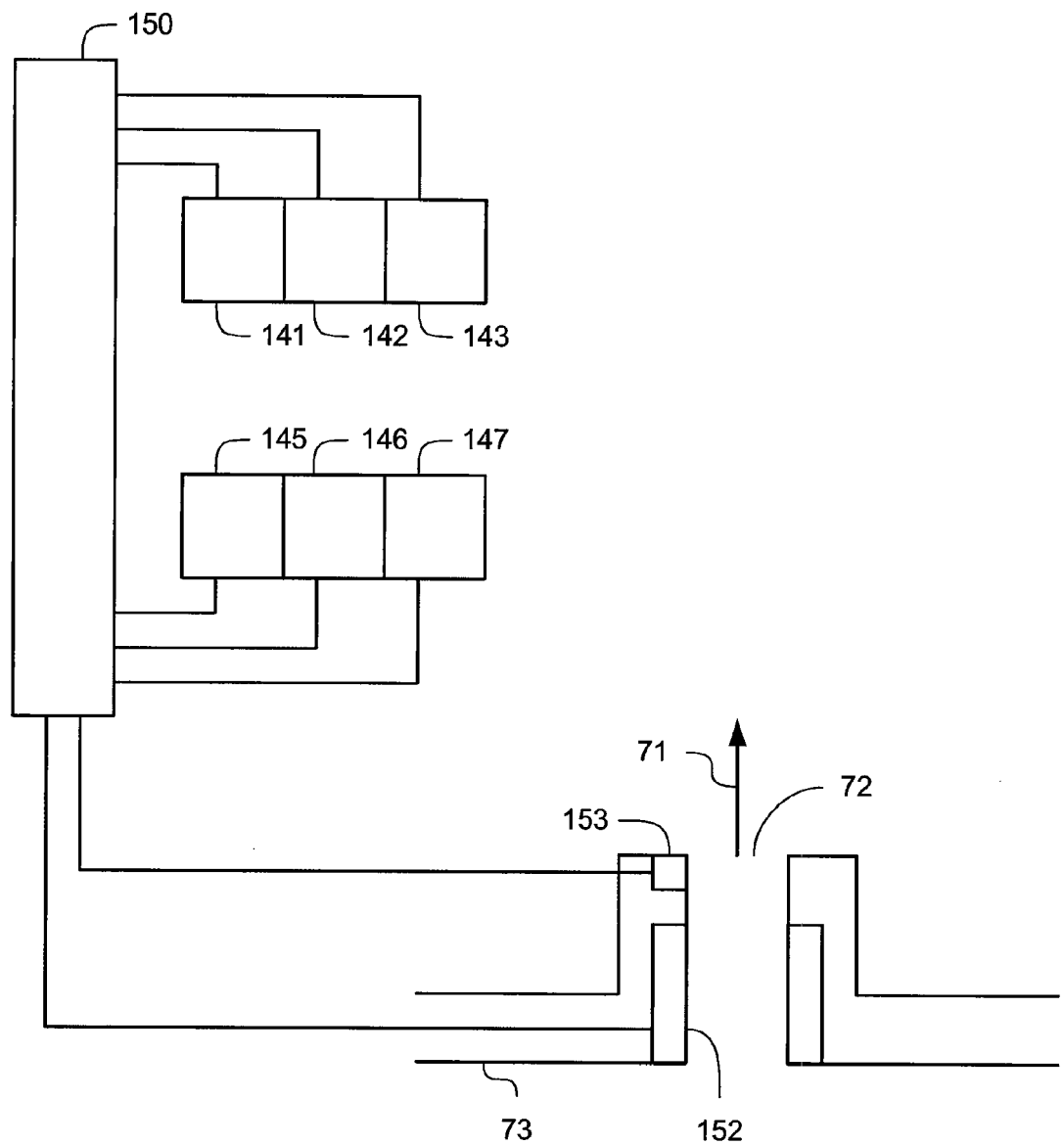
FIG. 17 depicts a control system for a thermal conditioning system according to an embodiment of the invention.

In an embodiment, as depicted in FIGS. 6 and 17, a heater 141 and/or a cooler 142 may be provided within the liquid reservoir 76 in order to adjust the temperature of the liquid within the reservoir 76. In addition a temperature sensor 143 may be provided in order to monitor the temperature of the liquid within the reservoir 76. Data from the sensor 143 may be used to control the heater 141 and/or cooler 142.

Alternatively or additionally, a heater 145 and/or cooler 146 may be provided within the manifold 74 in order to adjust the temperature of the liquid within the manifold 74. Likewise, a temperature sensor 147 may be provided within the manifold 74. A temperature sensor 147 within the manifold 74 may be used to provide control of the heater 141 and/or cooler 142 in the liquid reservoir 76 and the heater 145 and/or cooler 146 within the manifold 74. In either case, as depicted in FIG. 17, a controller 150 may be provided to control one or more of the heaters 141, 145 and/or coolers 142, 146 based on measurement data from the temperature sensors 143, 147.

In an embodiment, alternatively or additionally a heater 152 may be provided for one or more of the apertures 72 in order to adjust the temperature of liquid forming an individual jet 71 of liquid. A temperature sensor 153 may be provided downstream of the heater 152 in order to provide measurement data for the control of the heater 152. As depicted in FIG. 17, the heater 152 and temperature sensor 153 may be controlled by the controller 150.

It should be appreciated that such an arrangement may provide improved control of a thermal conditioning system. Accordingly, for example, it may be possible to control the thermal conditioning system to provide a consistent temperature across the support section 53 of the recess within the substrate table WT even when the heat load is not consistent across the support section 53. Furthermore, for example, the thermal conditioning system may be able to compensate for both positive and negative heat loads within the substrate table WT. Furthermore, for example, the thermal conditioning system may provide faster thermal conditioning for a substrate table WT than previously known systems in which a liquid is passed through a channel within the substrate table WT. This may be realized because each jet 71 may have its temperature individually controlled by a dedicated control loop comprising an actuator, such as a heater, and a feedback sensor, such as a temperature sensor.

Figure 18:
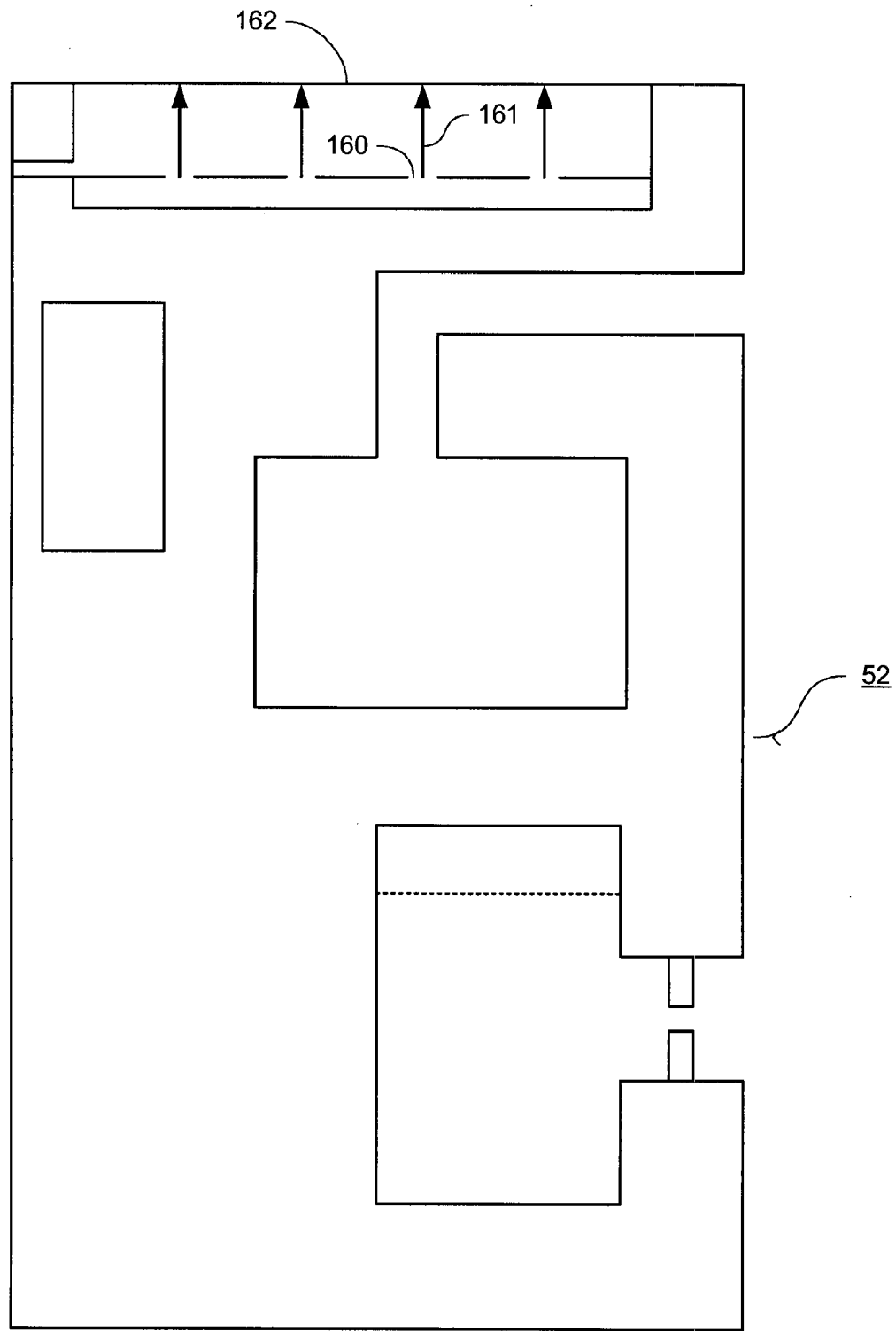
FIG. 18 depicts a portion of a thermal conditioning system according to an embodiment of the invention.

In an embodiment which may be combined with any of the embodiments discussed above, additional thermal conditioning may be provided to the peripheral section 52 of the substrate table WT as show in FIG. 18. In particular, the thermal conditioning system may be configured to provide one or more apertures 160 configured to direct one or more jets 161 of liquid in order to thermally condition a part 162 of the peripheral section 52 of the substrate table WT. It should be appreciated that such an arrangement may be provided within a substrate table WT that does not include a drain arrangement as discussed above. In other words, the thermal conditioning system may be configured to thermally condition both a central section of a substrate table WT which supports a substrate W and a peripheral section of the substrate table WT that surrounds the substrate W and may, for example, have an upper surface which is coplanar with an upper surface of the substrate W when supported on the substrate table WT.

FIG. 18 schematically depicts an arrangement for an embodiment including a drain corresponding to that depicted in FIG. 6. As shown, the thermal conditioning system is provided to thermally condition the top surface of the peripheral section 52 of the substrate table WT. The top surface 162 may, for example, be configured to be coplanar with the upper surface of a substrate W supported within the recess of the substrate table WT. As shown, the thermal conditioning system provides one or more jets 161 of liquid to the underside of the top surface 162 of the peripheral section 52 of the substrate table WT in a manner similar to that discussed above in relation to the thermal conditioning of the support section 53 of the recess. It should be appreciated that variations of the arrangements for thermally conditioning the support section 53 of the recess discussed above may apply to the thermal conditioning of the top surface 162 of the peripheral section 52 of the substrate table WT.

As depicted in FIG. 18, liquid maybe extracted from the thermal conditioning system within the peripheral section 52 of the substrate table WT after it has been directed onto the lower surface of the upper face 162 of the peripheral section 52. It should be appreciated that the liquid extraction may be performed by a separate extraction conduit to those previously discussed above. Alternatively, the extraction may be combined with any of the extraction conduits previous discussed.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

In an embodiment, there is provided an immersion lithographic apparatus, comprising: a substrate table, including a recess having a support section configured to support a substrate; a drain in the substrate table, configured to receive an immersion fluid which leaks, in use, into a gap between an edge of a substrate on the substrate table and an edge of the recess; and a thermal conditioning system, configured to thermally condition the support section of the recess; wherein the thermal conditioning system comprises at least one aperture, configured to direct a jet of fluid onto a reverse side of the support section of the recess that is opposite to a support side that supports the substrate.

In an embodiment, the substrate table includes a central section and a peripheral section that surrounds the central section; the recess is formed in the central section; and the drain is formed in the peripheral section.

In an embodiment, the central section and the peripheral section are separated from each other by an isolation system that is configured to minimise the transfer of at least one of heat and vibrations between the central section and the peripheral section.

In an embodiment, the thermal conditioning system is configured to thermally condition the peripheral section of the substrate table.

In an embodiment, the peripheral section of the substrate table includes a planar section having an upper surface which, in use, is parallel to an upper surface of a substrate supported in the recess, and a lower surface; and the thermal conditioning system comprises at least one aperture, configured to direct a jet of fluid onto the lower surface of the planar section of the peripheral section of the substrate table.

In an embodiment, the immersion lithographic apparatus comprises a fluid extraction system; and the fluid extraction system is configured to extract fluid that has been directed onto the reverse side of the support section of the recess.

In an embodiment, the fluid extraction system is configured such that fluid extracted after it has been directed onto the reverse side of the support section of the recess passes through at least one conduit in the peripheral section, of the substrate table; and the at least one conduit forms part of the thermal conditioning system and is used to thermally condition the peripheral section.

In an embodiment, the fluid extraction system is further configured to extract fluid from the drain.

In an embodiment, the fluid extraction system is configured such that fluid extracted from the drain and fluid extracted after it has been directed onto the reverse side of the support section of the recess is extracted through a common conduit in the peripheral section of the substrate table.

In an embodiment, the fluid extraction system is configured such that fluid extracted from the drain is extracted through a first conduit in the peripheral section of the substrate table and fluid extracted after it has been directed onto the reverse side of the support section of the recess is extracted through a second conduit in the peripheral section of the substrate table.

In an embodiment, the immersion lithographic apparatus comprises a fluid extraction system; and the fluid extraction system is configured to extract fluid from the drain and to extract fluid from the thermal conditioning system after it has been directed onto the reverse side of the support section of the recess.

In an embodiment, the fluid extracted from the drain and fluid extracted after it has been directed onto the reverse side of the support section of the recess is extracted through a common conduit in the substrate table.

In an embodiment, the fluid extraction system is configured such that fluid extracted from the drain is extracted through a first conduit in the substrate table and fluid extracted after it has been directed onto the reverse side of the support section of the recess is extracted through a second conduit in the peripheral section of the substrate table.

In an embodiment, the fluid extraction system comprises a fluid flow restrictor arranged to restrict the flow of fluid into the common conduit after it has been directed onto the reverse side of the support section of the recess.

In an embodiment, the thermal conditioning system comprises an aperture plate, in which the at least one aperture is provided; wherein the aperture plate is provided adjacent the support section of the recess such that a respective jet of fluid provided by the at least one aperture is directed onto the reverse side of the support section of the recess.

In an embodiment, each of the at least one apertures is formed in a respective nozzle which protrudes from the aperture plate in the direction of the support section of the recess.

In an embodiment, the at least one aperture is coplanar with a surface of the aperture plate that faces the support section of the recess.

In an embodiment, the support section of the recess is supported by a plurality of thin walls in turn supported by the aperture plate.

In an embodiment, the plurality of thin walls include at least one hollow pillar; and at least one aperture in the aperture plate is provided such that the corresponding jet of fluid is provided with the hollow pillar.

In an embodiment, the immersion lithographic further comprises an actuator system configured to move the substrate table, in use, in a scanning direction; and a plurality of the thin walls are planar and arranged such that a line within the plane of the walls is parallel to the scanning direction.

In an embodiment, the aperture plate and the support section of the recess in part define a space which is sealed apart from the at least one aperture and at least one outlet for extracting the fluid after it has been directed onto the reverse side of the support section of the recess.

In an embodiment, the at least one outlet is arranged such that, in use, a continuous film of fluid covers the aperture plate.

In an embodiment, a porous material is provided on the aperture plate.

In an embodiment, the thermal conditioning system is configured such that, in use, the space is filled with fluid.

In an embodiment, the reverse side of the support section of the recess includes an indent associated with each jet of fluid, which is configured such that the fluid directed into the indent is directed back towards the aperture plate.

In an embodiment, the thermal conditioning system includes a fluid manifold configured to provide fluid to the at least one aperture in the aperture plate.

In an embodiment, the manifold is provided in a space on the opposite side of the aperture plate to the support section of the recess.

In an embodiment, the fluid is provided from a fluid reservoir to the manifold through one or a plurality of openings into the manifold.

In an embodiment, at least one of a cooler and a heater is provided in at least one of the fluid reservoir and the manifold.

In an embodiment, at least one of a heater and a cooler is provided upstream of each of the at least one aperture and arranged to heat or cool the fluid before it exits the respective aperture.

In an embodiment, the lithographic apparatus further comprises at least one temperature sensor downstream of the at least one heater and cooler; and a controller configured to control the at least one heater and cooler based on measurement data from the at least one temperature sensor.

In an embodiment, the peripheral section of the substrate table comprises a heater arranged to heat directly the peripheral section of the substrate table.

In an embodiment, there is provided a device manufacturing method comprising: providing a substrate to a recess in a substrate table, the recess having a support section configured to support the substrate; providing immersion fluid to an upper surface of the substrate; extracting immersion fluid that leaks into a gap between an edge of the substrate and an edge of the recess through a drain in the substrate table; and thermally conditioning the support section of the recess by directing at least one jet of fluid onto a reverse side of the support section of the recess that is opposite a support side that supports the substrate.

In an embodiment, there is provided a lithographic apparatus, comprising: a substrate table, including a recess having a support section configured to support a substrate and a peripheral section, surrounding the recess; and a thermal conditioning system, configured to thermally condition the support section of the recess and the peripheral section of the substrate table; wherein the thermal conditioning system comprises at least one aperture, configured to direct a jet of fluid onto a reverse side of the support section of the recess that is opposite to a support side that supports the substrate, and at least one aperture, configured to direct a jet of fluid onto a portion of the peripheral section of the substrate table.

In an embodiment, there is provided a device manufacturing method comprising: providing a substrate to a recess in a substrate table, the recess having a support section configured to support the substrate and the substrate table having a peripheral section surrounding the recess; thermally conditioning the support section of the recess by directing at least one jet of fluid onto reverse side of the support section of the recess that is opposite a support side that supports the substrate; and thermally conditioning the peripheral section of the substrate table by directing at least one jet of fluid onto a portion of the peripheral section of the substrate table.

The invention claimed is:

1. An immersion lithographic apparatus, comprising:
a substrate table including a recess having a central support section configured to support a substrate, the central support section having a support surface to support a bottom surface of the substrate, having a lateral surface at a non-zero angle to the support surface, and having a bottom surface at a non-zero angle to the lateral surface and facing away from the support surface, the lateral surface extending to the bottom surface of the central support section;
a drain in the substrate table, the drain configured to receive an immersion fluid which leaks, in use, into a gap between an edge of the substrate on the substrate table and an edge of the recess, the drain having an orifice above the bottom surface of the central support section;
a peripheral section of the substrate table that surrounds the central support section, the drain located in the peripheral section and wherein at least a majority of the height of the lateral surface of the central support section is spaced by an open gap from at least a majority of the height of a lateral surface of the peripheral section, the lateral surface of the peripheral section faces the lateral surface of the central support section, and the open gap extends around the central support section and is outward, in a horizontal direction, of an outer periphery of the bottom surface of the substrate, wherein an uppermost surface of the peripheral section adjacent the substrate is generally coplanar with an upper surface of the substrate, and an edge of the peripheral section defines the edge of the recess; and
a thermal conditioning system configured to thermally condition at least the central support section.

2. The immersion lithographic apparatus of claim 1, wherein the peripheral section of the substrate table comprises a heater arranged to heat directly the peripheral section of the substrate table.

3. The immersion lithographic apparatus of claim 1, wherein the open gap extends along the entire height of the lateral surfaces of the central support section and, the peripheral section such that the central support section and the peripheral section are separated.

4. The immersion lithographic apparatus of claim 1, further comprising a solid member spanning the open gap to directly connect the central support section and the peripheral section.

5. The immersion lithographic apparatus of claim 4, wherein the open gap extends below the member.

6. The immersion lithographic apparatus of claim 4, wherein the member is configured to reduce transfer of vibrations between the peripheral section and the central support section.

7. The immersion lithographic apparatus of claim 4, comprising a further member spanning the open gap to directly connect the central support section and the peripheral section, the open gap extending above the further member.

8. The immersion lithographic apparatus of claim 4, wherein the member is a separate body from the central support section and the peripheral section.

9. The immersion lithographic apparatus of claim 4, wherein the member comprises a different material than the material of the central support section.

10. The immersion lithographic apparatus of claim 1, wherein the orifice of the drain is in the lateral surface of the peripheral section.

11. The immersion lithographic apparatus of claim 10, wherein the orifice is located at or above a top surface of the central support section.

12. The immersion lithographic apparatus of claim 1, wherein the thermal conditioning system comprises an aperture configured to direct a jet of fluid onto a surface of the central support section below the substrate at an angle at least non-parallel to the surface and comprising an aperture plate, in which the aperture is provided, the aperture plate provided adjacent the surface such that the jet of fluid provided by the aperture is directed onto the surface.

13. A device manufacturing method comprising:
providing a substrate to a recess in a substrate table, the recess having a central support section configured to support the substrate, the central support section having a support surface that supports a bottom surface of the substrate, having a lateral surface at a non-zero angle to the support surface, and having a bottom surface at a non-zero angle to the lateral surface and facing away from the support surface, the lateral surface extending to the bottom surface of the central support section;
providing a peripheral section of the substrate table that surrounds the central support section, wherein at least a majority of the height of the lateral surface of the central support section is spaced by an open gap from at least a majority of the height of a lateral surface of the peripheral section, the lateral surface of the peripheral section faces the lateral surface of the central support section, and the open gap extends around the central support section and is outward, in a horizontal direction, of an outer periphery of the bottom surface of the substrate;
providing immersion fluid to an upper surface of the substrate and/or the substrate table, wherein an uppermost surface of the peripheral section adjacent the substrate is generally coplanar with the upper surface of the substrate;
draining the immersion fluid that leaks into a gap between an edge of the substrate and an edge of the recess through a drain located in the peripheral section, wherein an edge of the peripheral section defines the edge of the recess and the drain has an orifice above the bottom surface of the central support section; and
thermally conditioning at least the central support section.

14. A lithographic apparatus, comprising:
a substrate table including a recess having a central support section configured to support a substrate, the central support section having a support surface to support a bottom surface of the substrate and having a lateral surface at a non-zero angle to the support surface;
a peripheral section surrounding the central support section, wherein at least part of the lateral surface of the central support section is spaced by an open gap from at least part of a lateral surface of the peripheral section, the open gap is outward, in a horizontal direction, of an outer periphery of the bottom surface of the substrate, and the open gap extends around the central support section, wherein an uppermost surface of the peripheral section adjacent the substrate is generally coplanar with an upper surface of the substrate;

a solid member spanning the open gap to directly connect the central support section and the peripheral section, the open gap extending below the member;

a drain in the peripheral section, the drain configured to receive an immersion fluid which leaks, in use, into a gap between an edge of the substrate on the substrate table and an edge of the recess and the drain having an orifice above the member, wherein an edge of the peripheral section defines the edge of the recess; and a thermal conditioning system configured to thermally condition at least the central support section.

15. The immersion lithographic apparatus of claim 14, wherein the member is configured to reduce transfer of vibrations between the peripheral section and the central support section.

16. The immersion lithographic apparatus of claim 14, comprising a further member spanning the open gap to directly connect the central support section and the peripheral section, the open gap extending above the further member.

17. The immersion lithographic apparatus of claim 14, wherein the peripheral section comprises a heater arranged to heat directly the peripheral section.

18. The immersion lithographic apparatus of claim 14, wherein the orifice of the drain is in the lateral surface of the peripheral section.

19. The immersion lithographic apparatus of claim 18, wherein the orifice is located at or above a top surface of the central support section.

20. The immersion lithographic apparatus of claim 14, wherein the member is a separate body from the central support section and the peripheral section.

21. A device manufacturing method comprising:

providing a substrate to a recess in a substrate table, the recess having a central support section configured to support the substrate, the central support section having a support surface that supports a bottom surface of the substrate and having a lateral surface at a non-zero angle to the support surface, and the substrate table having a peripheral section surrounding the central support section, wherein at least part of the lateral surface of the central support section is spaced by an open gap from at least part of a lateral surface of the peripheral section, the open gap is outward, in a horizontal direction, of an outer periphery of the bottom surface of the substrate, and the open gap extends around the central support section;

spanning the open gap using a solid member to directly connect the central support section and the peripheral section, the open gap extending below the member;

providing immersion fluid to an upper surface of the substrate and/or the substrate table, wherein an uppermost surface of the peripheral section adjacent the substrate is generally coplanar with the upper surface of the substrate;

draining the immersion fluid that leaks into a gap between an edge of the substrate and an edge of the recess through an orifice of a drain in the peripheral section, the orifice located above the member, wherein an edge of the peripheral section defines the edge of the recess; and thermally conditioning at least the central support section.

* * * * *